US007759976B2

(12) United States Patent
Ogawa

(10) Patent No.: US 7,759,976 B2
(45) Date of Patent: Jul. 20, 2010

(54) LEVEL SHIFT CIRCUIT

(75) Inventor: Yasushige Ogawa, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 11/844,644

(22) Filed: Aug. 24, 2007

(65) Prior Publication Data

US 2008/0048719 A1 Feb. 28, 2008

(30) Foreign Application Priority Data

Aug. 24, 2006 (JP) .............................. 2006-227607
Aug. 16, 2007 (JP) .............................. 2007-212404

(51) Int. Cl.
*H03K 19/0175* (2006.01)
(52) U.S. Cl. ....................................................... 326/63
(58) Field of Classification Search ............ 326/63–68, 326/80, 81, 24; 327/333
See application file for complete search history.

(56) References Cited

U.S. PATENT DOCUMENTS 4,959,562 A * 9/1990 Ootani ......................... 326/24

6,124,732 A * 9/2000 Zilic et al. .................... 326/63
7,112,996 B2 * 9/2006 Lee .............................. 326/68
7,145,364 B2 * 12/2006 Bhattacharya et al. ........ 326/68
2005/0024088 A1 * 2/2005 Lee .............................. 326/81

FOREIGN PATENT DOCUMENTS

| JP | 05-315931 A | 11/1993 |
| JP | 09-135160 A | 5/1997 |
| JP | 2003-017996 A | 1/2003 |

* cited by examiner

*Primary Examiner*—Vibol Tan
*Assistant Examiner*—Crystal L Hammond
(74) *Attorney, Agent, or Firm*—Fujitsu Patent Center

(57) ABSTRACT

A level shift circuit determining a logic value while preventing load capacitance from increasing. A voltage detector detects the states of first and second voltages and generates first and second detection signals. A first logic unit generates a first control signal having a level that is in accordance with an input signal or a level of a third voltage in response to the first detection signal. A second logic unit generates a second control signal having a level that is in accordance with the first control signal or a level of the second voltage in response to the second detection signal. A level converter generates an output signal based on the first and second control signals and clamps the output signal at a fixed level when an abnormality occurs in the first voltage.

20 Claims, 5 Drawing Sheets

LEVEL SHIFT CIRCUIT

CROSS-REFERENCE TO RELATED APPLICATIONS

This application is based upon and claims the benefit of priority from the prior Japanese Patent Applications No. 2006-227607, filed on Aug. 24, 2006, and No. 2007-212404, filed on Aug. 16, 2007, the entire contents of which are incorporated herein by reference.

BACKGROUND

1. Field

The embodiments relates to a level shift circuit for use in a semiconductor device operated by a plurality of power supply voltages.

2. Description of the Related Art

In recent years, semiconductor devices are required to operate with less power consumption. To reduce power consumption in a semiconductor device, an internal circuit in the semiconductor device is configured to process a signal having a lower level than an external signal provided to the device. In other words, the internal circuit is operated by a power supply voltage having a level that is lower than the level of a signal used in an external device. A level shift circuit for converting a signal level between the level for an external device and the level used for an internal circuit is used in an input circuit and an output circuit of the semiconductor device.

In the prior art, a level shift circuit used as an output circuit is supplied with a first power supply voltage and a second power supply voltage, which is higher than the first power supply voltage. The level shift circuit converts the signal level of an internal circuit operated by the first power supply voltage to the signal level of the second power supply voltage. When the level shift circuit is supplied with the first and second power supply voltages at different timings, the level shift circuit may function erroneously and cause the flow of through current. To prevent such flow of through current, various types of level shift circuits have been proposed.

For example, Japanese Laid-Open Patent Publication No. 2003-17996 (FIG. 1) describes a level shift circuit including capacitors C1 and C2 and transistors N3 and N4. The level shift circuit determines the gate voltage of each of the transistors N3 and N4 with the capacitors C1 and C2 when supplied with a high power supply voltage and determines the logic value of a signal VOUT. This prevents the flow of a through-current.

Japanese Laid-Open Patent Publication No. 9-135160 (FIG. 1) describes a semiconductor device including transistors 146 and 147 arranged between a high-voltage side circuit block and a low-voltage side circuit block. The semiconductor device forcibly clamps an input level when the low voltage power supply is cut. This prevents the flow of a through-current.

Japanese Laid-Open Patent Publication No. 5-315931 (FIG. 1) describes a level shift circuit including a detection circuit. In a state in which the level shift circuit is being supplied with a high power supply voltage and a low power supply voltage, the detection circuit detects abnormalities in the low power supply voltage. When detecting an abnormality in the low power supply voltage, the detection circuit turns off a transistor QP1 and cuts the power supply. This prevents the flow of a through-current. Further, the detection circuit turns on a transistor QN1 to clamp the input potential at an inverter circuit 4. This prevents abnormal functioning of the level shift circuit.

SUMMARY

The embodiment provides that a level shift circuit receiving a first voltage and a second voltage and generating an output signal from an input signal. The level shift circuit includes a first logic unit receiving the input signal and generating a first control signal in accordance with an operation control signal indicating a supply state of the first voltage. The first logic unit generates a first control signal in accordance with the input signal when the level shift circuit is supplied with the first and second voltages. The first logic unit generates the first control signal at a predetermined first level when the level shift circuit is supplied with only the second voltage. A second logic unit, coupled to the first logic unit, generates a second control signal in accordance with the operation control signal. The second logic unit generates the second control signal in accordance with the first control signal when the level shift circuit is supplied with the first and second voltages. The second logic unit generates the second control signal at a predetermined second level when the level shift circuit is supplied with only the second voltage. A level converter, coupled to the first logic unit and the second logic unit, generates the output signal in response to the first and second control signals.

BRIEF DESCRIPTION OF THE DRAWINGS

The embodiments, together with objects and advantages thereof, may best be understood by reference to the following description of the embodiments together with the accompanying drawings in which.

DETAILED DESCRIPTION OF THE PREFERRED EMBODIMENTS

Figure 1:
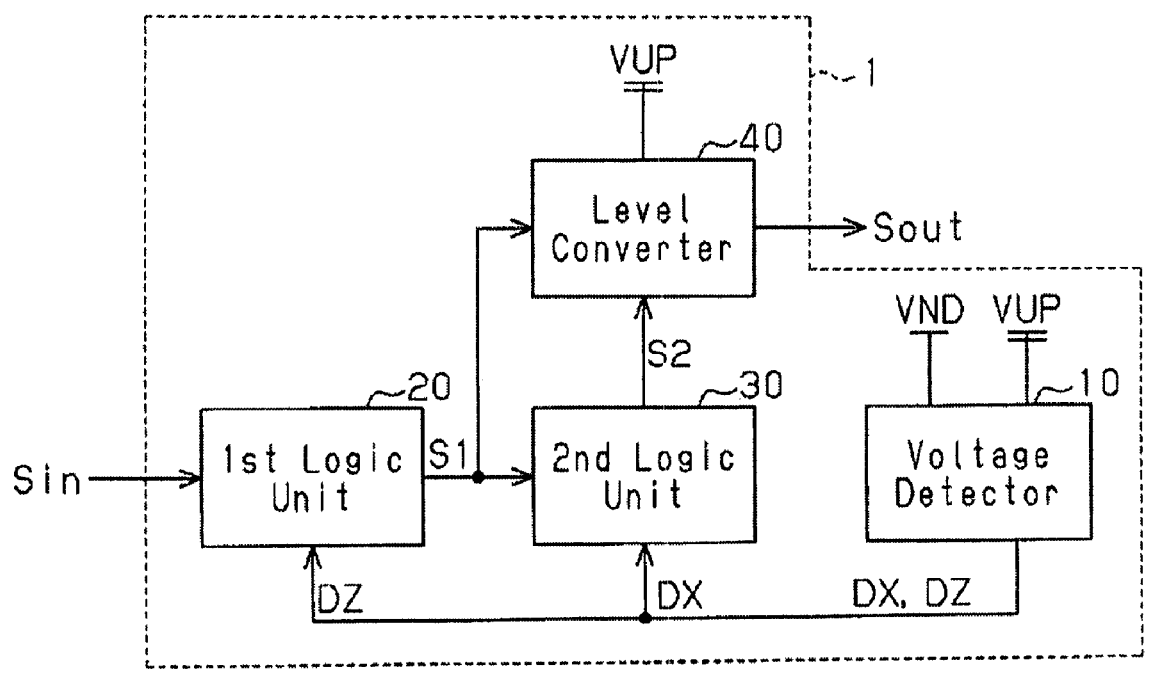
FIG. 1 is a schematic block circuit diagram of a level shift circuit in accordance with one embodiment.

In the drawings, like numerals are used for like elements throughout.

A level shift circuit 1 in accordance with one embodiment will now be described with reference to FIGS. 1 and 2.

With reference to FIG. 1, the level shift circuit 1 converts an input signal Sin having a first high potential voltage level or low potential voltage level to an output signal Sout having a second high potential voltage level, which is higher than the first high potential voltage level, or low potential voltage level. In embodiments, the first high potential voltage level is referred to as the "H1 level", the second high potential voltage level is referred to as the "H2 level," and the low potential voltage level is referred to as the "L level."

The level shift circuit 1 includes a voltage detector 10, a first logic unit 20, a second logic unit 30, and a level converter 40.

The voltage detector 10 is supplied with a first high potential voltage VND (first voltage) and a second high potential voltage VUP (second voltage) that is higher than the voltage VND. The voltage detector 10 detects the voltages VND and VUP and generates detection signals DX and DZ in accordance with the supply state of the voltages VND and VUP. In detail, the voltage detector 10 generates an H2 level detection signal DX and an L level detection signal DZ when the level shift circuit 1 is supplied with the voltages VND and VUP. The voltage detector 10 generates an L level detection signal DX and an H2 level detection signal DZ when the level shift circuit 1 is supplied with the second high potential voltage VUP but not with the first high potential voltage VND.

The first logic unit 20 is provided with the input signal Sin and the detection signal DZ. Further, the first logic unit 20 is supplied with the first high potential voltage VND (refer to FIG. 2). The first logic unit 20 generates a first control signal S1 in accordance with the detection signal DZ. In detail, when the level shift circuit 1 is supplied with the first and second high potential voltages VND and VUP, the first logic unit 20 generates a first control signal S1 having a level that is in accordance with the input signal Sin in response to the L level detection signal DZ. When the level shift circuit 1 is supplied with the second high potential voltage VUP but not with the first high potential voltage VND, the first logic unit 20 generates an L level first control signal S1 in response to the H2 level detection signal DZ.

The second logic unit 30 is supplied with the first control signal S1 and the detection signal DX. The second logic unit 30 is further supplied with the first high potential voltage VND and the second high potential voltage VUP (refer to FIG. 2). The second logic unit 30 generates a second control signal S2 in accordance with the detection signal DX. In detail, when the level shift circuit 1 is supplied with the first and second high potential voltages VND and VUP, the second logic unit 30 generates a second control signal S2 having a level that is in accordance with the first control signal S1 in response to the H2 level detection signal DX. When the level shift circuit 1 is supplied with the second high potential voltage VUP but not with the first high potential voltage VND, the second logic unit 30 generates a second control signal S2 having an H2 level in response to the L level detection signal DX.

The level converter 40 is supplied with the first control signal S1 and the second control signal S2. The level converter 40 is further supplied with the second high potential voltage VUP. The level converter 40 generates an output signal having the H2 level or the L level based on the first control signal S1 and the second control signal S2.

When the level shift circuit 1 is supplied with the first high potential voltage VND and the second high potential voltage VUP, the first logic unit 20 generates a first control signal S1 having a level that is in accordance with the input signal Sin. The second logic unit 30 then generates a second control signal S2 having a level that is in accordance with the first control signal S1. More specifically, the first and second logic units 20 and 30 generate the control signals S1 and S2 in accordance with the input signal Sin. The level converter 40 then generates an output signal Sout that shifts between the H2 level and the L level in accordance with the first control signal S1 and the second control signal S2. The input signal Sin has the H level or the L level. As a result, the level shift circuit 1 converts the input signal Sin that shifts between the H1 level and the L level into the output signal Sout that shifts between the H2 level and the L level.

When the level shift circuit 1 is not supplied with the first high potential voltage VND but is supplied with the second high potential voltage VUP, the first logic unit 20 and the second logic unit 30 generate a first control signal S1 having a predetermined level and a second control signal S2 having a predetermined level. In this case, the level of each of the control signals S1 and S2 that are supplied to the level converter 40 is clamped. Accordingly, the level shift circuit generates the output signal Sout having a predetermined level (either the H2 level or the L level).

The structure of the level shift circuit 1 shown in FIG. 1 will now be described in detail.

Figure 2:
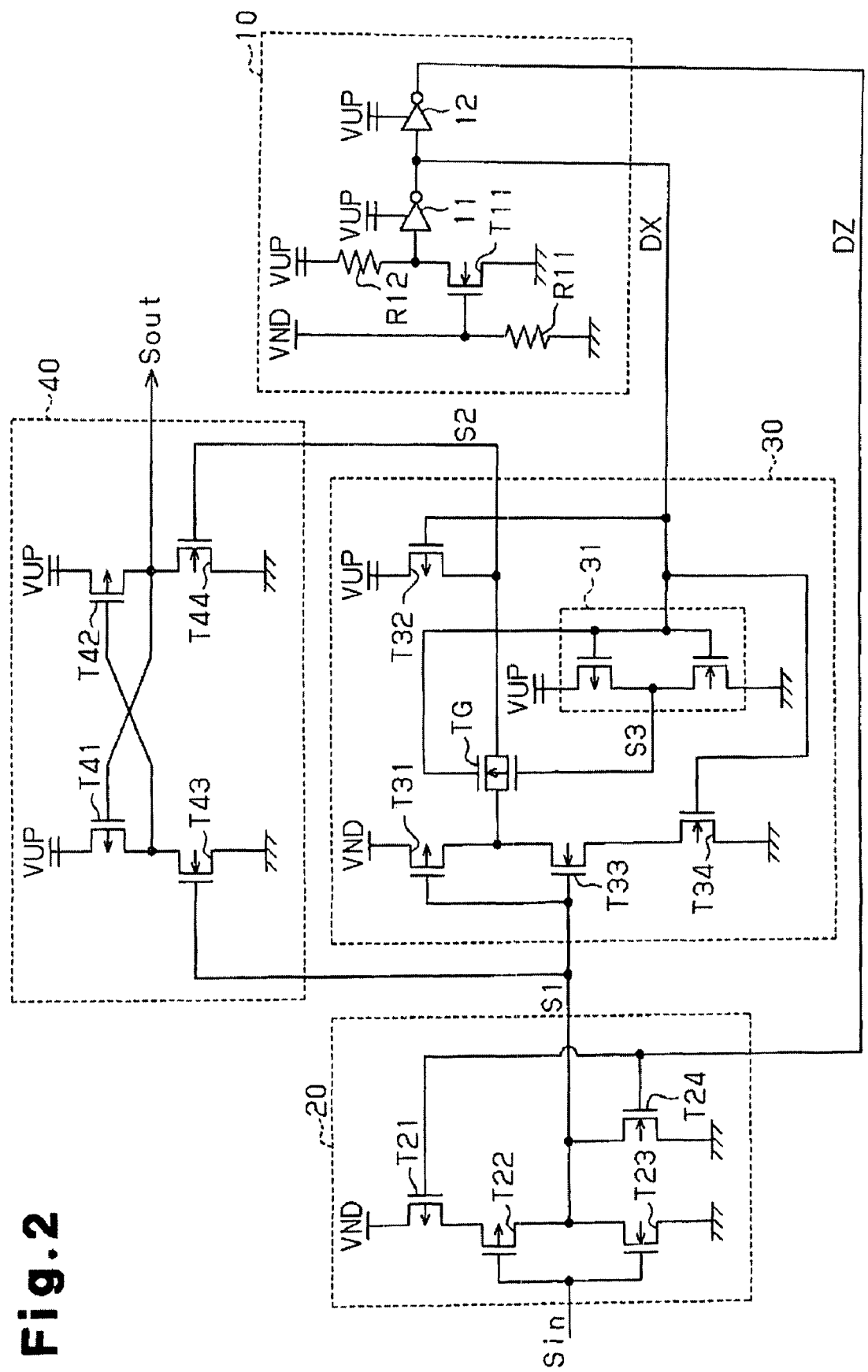
FIG. 2 is a schematic circuit diagram of the level shift circuit shown in FIG. 1.

As shown in FIG. 2, the voltage detector 10 includes resistors R11 and R12, an N-channel MOS transistor T11, and inverter circuits 11 and 12. The gate of the transistor T11 is supplied with the first high potential voltage VND. Further, the gate of the transistor T11 is connected to a low potential voltage (third voltage, ground in the preferred embodiment) via the resistor R11. The source of the transistor T11 is connected to the ground, and the drain of the transistor T11 is supplied with the second high potential voltage VUP via the resistor R12. A node between the transistor T11 and the resistor R12 is connected to an input terminal of the inverter circuit 11.

An output terminal of the inverter circuit 11 is connected to an input terminal of the inverter circuit 12. In other words, the inverter circuits 11 and 12 are connected in series. The inverter circuits 11 and 12 are supplied with the second high potential voltage VUP functioning as the operation voltage. The inverter circuit 11 of the initial stage logically inverts the potential at the drain of the transistor T11 to generate a detection signal DX having the inverted level of the drain potential. The inverter circuit 12 of the subsequent stage logically inverts the detection signal DX to generate a detection signal DZ having the inverted level of the signal DX.

The first logic unit 20 includes an NOR circuit. The NOR circuit includes P-channel MOS transistors T21 and T22 and N-channel MOS transistors T23 and T24. The source of the transistor T21 is supplied with the first high potential voltage VND. The drain of the transistor T21 is connected to the source of the transistor T22. The drain of the transistor T22 is connected to drains of the transistors T23 and T24. The sources of the transistors T23 and T24 are connected to ground. The gates of the transistors T21 and T24 are provided with the detection signal DZ, and the gates of the transistors T22 and T23 are provided with the input signal Sin. The first control signal S1 is generated at a node between the transistors T22 and T23.

The second logic unit 30 includes a NAND circuit. The NAND circuit includes P-channel MOS transistors T31 and T32 and N-channel MOS transistors T33 and T34. The source of the transistor T31 is supplied with the first high potential voltage VND. The source of the transistor T32 is supplied with the second high potential voltage VUP. The drain of the transistor T31 is connected to the drain of the transistor T33. The source of the transistor T33 is connected to the drain of the transistor T34. The source of the transistor T34 is connected to ground. The gates of the transistors T31 and T33 are provided with the first control signal S1 that is output from the first logic unit 20. The gates of the transistors T32 and T34 are provided with the detection signal DX.

The second logic unit 30 further includes a transfer gate TG, which functions as a switch circuit and which is connected to the drains of the transistors T31 and T32, and an inverter circuit 31, which functions as a control circuit for controlling the transfer gate TG. The transfer gate TG is formed by a P-channel MOS transistor and an n-channel MOS transistor that are connected in parallel. The gate of the N-channel MOS transistor of the transfer gate TG is provided with the detection signal DX. The gate of the P-channel MOS transistor of the transfer gate TG is provided with an output signal S3 of the inverter circuit 31. The inverter circuit 31 is formed by a P-channel MOS transistor and an N-channel MOS transistor that are connected in series between the second high potential voltage VUP and ground. The gates of the two transistors of the inverter circuit 31 are provided with the detection signal DX. The inverter circuit 31 logically inverts the detection signal DX to generate an output signal S3 having the inverted level of the detection signal. As a result, the transfer gate TG is turned on when the detection signal DX has the H2 level and turned off when the detection signal DX has the L level. The second control signal S2 is generated at a node between the transistor T32 and the transfer gate TG.

The level converter 40 includes P-channel MOS transistors T41 and T42 and N-channel. MOS transistors T43 and T44. The sources of the transistors T41 and T42 are supplied with the second high potential voltage VUP. The drain of the transistor T41 is connected to the gate of the transistor T42. The drain of the transistor T42 is connected to the gate of the transistor T41. Further, the drain of the transistor T43 is connected to the drain of the transistor T41, and the drain of the transistor T44 is connected to the drain of the transistor T42. The sources of the transistors T43 and T44 are connected to ground. The gate of the transistor T43 is provided with the first control signal S1 that is output from the first logic unit 20. The gate of the transistor T44 is provided with the second control signal S2 that is output from the second logic unit 30.

The operation of the level shift circuit 1 will now be described.

[When the level shift circuit 1 is supplied with the first and second high potential voltages VND and VUP]

The transistor T11 of the voltage detector 10 is turned on in response to the first high potential voltage VND supplied to its gate. As a result, the voltage detector 10 generates an H2 level detection signal DX and an L level detection signal DZ.

In response to the L level detection signal DZ, the transistor T21 of the first logic unit 20 is turned on and the transistor T24 of the first logic unit 20 is turned off. As a result, the first logic unit 20 inverts the input signal Sin with the transistors T21, T22, and T23 to generate the first control signal S1 having the inverted level of the input signal Sin.

In response to the H2 level detection signal DX, the transistor T32 of the second logic unit 30 is turned off and the transistor T34 of the second logic unit 30 is turned on. Further, the transfer gate TG is turned on in response to the H2 level detection signal DX. As a result, the second logic unit 30 inverts the first control signal S1 with the transistors T31, T33, and T34 to generate the second control signal S2 having the inverted level of the signal S1.

The transistor T43 of the level converter 40 is provided with the first control signal S1, and the transistor T44 of the level converter 40 is provided with the second control signal S2 that is an inverted signal of the signal S1. As a result, the transistors T43 and T44 are turned on and off in a complementary manner. The level converter 40 generates an H2 level signal Sout when the transistor T43 is turned on and generates an L level signal Sout when the transistor T44 is turned on.

As a result, when supplied with the first and second high potential voltages VND and VUP, the level shift circuit 1 generates an L level output signal Sout in response to the H1 level input signal Sin and generates an H2 level output signal Sout in response to the L level input signal Sin.

[When the level shift circuit 1 is supplied with only the second high potential voltage VUP]

The transistor T11 of the voltage detector 10 is turned off because its gate is connected to the ground via the resistor R11. As a result, the voltage detector 10 generates an L level detection signal DX and an H2 level detection signal DZ.

In response to the H2 level detection signal DZ, the transistor T21 of the first logic unit 20 is turned off and the transistor T24 of the first logic unit 20 is turned on. As a result, the first logic unit 20 generates an L level first control signal S1 with the transistor T24.

The transistor T32 of the second logic unit 30 is turned on in response to the L level detection signal DX, and the transistor T34 of the second logic unit 30 is turned off. Further, the transfer gate TG is turned off in response to the detection signal DX. As a result, the second logic unit 30 generates an H2 level second control signal S2 with the transistor T32. The transfer gate TG is turned off in response to the L level detection signal DX. As a result, the transfer gate TG prevents current from flowing from the second high potential voltage VUP toward the first high potential voltage VND. In other words, when the level shift circuit 1 is supplied with only the second high potential voltage VUP, the transistor T32 is turned on and the transistor T31 is also turned on in response to the L level first control signal S1. As a result, a potential difference is generated between the drains of the transistors T32 and T31. However, even in this case, the transfer gate TG arranged between the drains of the transistors T31 and T32 is turned off. This prevents current from flowing from the second high potential voltage VUP toward the first high potential voltage VND.

The transistor T43 of the level converter 40 is provided with the L level first control signal S1 and the transistor T44 of the level converter 40 is provided with the H2 level second control signal S2. As a result, the transistor T43 is turned off, and the transistor T44 is turned on. Accordingly, the level converter 40 generates an L level signal Sout so that the potential at an output node between the transistors T42 and T44 is clamped to the L level.

As a result, the level shift circuit 1 generates an L level output signal Sout when the level shift circuit 1 is not supplied with the first high potential voltage VND and is supplied with only the second high potential voltage VUP.

The level shift circuit 1 of one embodiment has the advantages described below.

(1) When the level shift circuit 1 is supplied with the first and second high potential voltages VND and VUP, the first and second logic units 20 and 30 respectively generate the first and second control signals S1 and S2 in accordance with the input signal Sin. As a result, the level converter 40 converts the input signal Sin that shifts between the H1 level and the L level to the output signal Sout that shifts between the H2 level and the L level. When the level shift circuit 1 is supplied with only the second high potential voltage VUP, the first logic unit 20 generates an L level first control signal S1 and the second logic unit 30 generates an H2 level second control signal S2. This determines the logic used in the level converter 40. As a result, through-current is prevented from flowing through the level converter 40. Further, there is no capacitance added to the level converter 40. This prevents load capacitance from increasing at the output terminal of the level shift circuit 1.

(2) The first logic unit 20 is formed by a NOR circuit, and the second logic unit 30 is formed by a NAND circuit. Thus, when the level shift circuit 1 is supplied with only the second high potential voltage VUP, regardless of the level of the input signal Sin, the level shift circuit 1 is supplied with an L level first control signal S1 and an H2 level second control signal S2 based on the detection signals DX and DZ. This determines the logic of the output signal Sout.

(3) The transistor T11 of the voltage detector 10 is turned on when the level shift circuit 1 is supplied with the first and second high potential voltages VND and VUP, and is turned off when the level shift circuit 1 is supplied with only the second high potential voltage VUP. Thus, the supply state of each of the first and second high potential voltages VND and VUP is detectable based on the detection signals DZ and DX. In other words, an abnormality in the first high potential voltage VND is detectable from the detection signals DZ and DX.

(4) The voltage detector 10 detects the state of each of the first high potential voltage VND and the second high potential voltage VUP to generate the first and second detection signals DZ and DX, which are complementary to each other. The first logic unit 20 is provided with the first detection signal DZ, and the second logic unit 30 is provided with the second detection signal DX. Accordingly, when the level shift circuit 1 is supplied with only the second high potential voltage VUP, regardless of the level of the input signal Sin, the level converter 40 is provided with an L level first control signal S1 and an H level second control signal S2. This determines the logic of the output signal Sout.

(5) The transistor T31 of the second logic unit 30, which receives the first high potential voltage VND, is controlled by the first control signal S1. The transistor T32 of the second logic unit 30, which receives the second high potential voltage VUP, is controlled by the detection signal DX. The transfer gate TG of the second logic unit 30, which is connected between the transistor T31 and the transistor T32, is turned on in a manner complementary to the transistor T32 by the detection signal DX. The second control signal S2 is generated at the node between the transistor T32 and the transfer gate TG.

When the level shift circuit 1 is not supplied with the first high potential voltage VND, the transistors T31 and T32 are turned on, and a potential difference is generated between the drains of the transistors T32 and T31. In this state, the transfer gate TG connected between the transistors T31 and T32 is turned off. This prevents current from flowing from the second high potential voltage VUP to the first high potential voltage VND.

A level shift circuit 56 according to another embodiment will now be described with reference to FIGS. 3 and 4.

Figure 3:
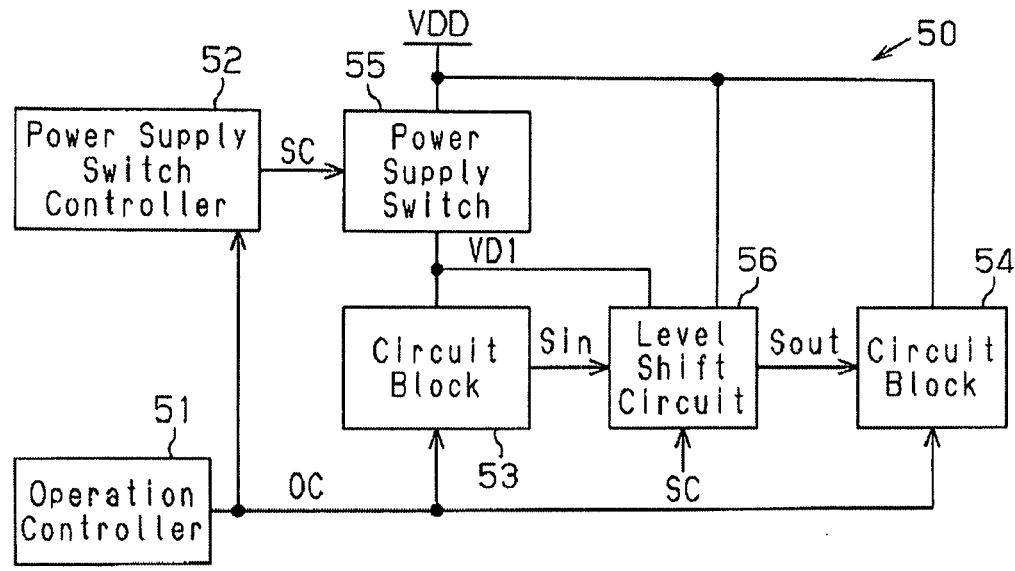
FIG. 3 is a schematic block circuit diagram of a semiconductor integrated circuit device including a level shift circuit according to another embodiment.

FIG. 3 is a schematic block circuit diagram of a semiconductor integrated circuit device 50 including a level shift circuit 56. The semiconductor integrated circuit device 50 includes an operation controller 51, which provides a power supply switch controller 52 and circuit blocks 53 and 54 with an operation control signal OC for controlling the operation state of the device 50. The power supply switch controller 52 generates a switch control signal SC (state control signal) in response to the operation control signal OC and provides the power supply switch 55 and the level shift circuit 56 with the switch control signal SC.

The power supply switch 55 is supplied with high potential voltage VDD. The power supply switch 55 is turned on and off in response to a switch control signal SC. When the power supply switch 55 goes on, the power supply switch 55 supplies the first circuit block 53 and the level shift circuit 56 with high potential voltage VD1, which is based on the high potential voltage VDD. In another embodiment, the high potential voltage VD1 has the same level as the high potential voltage VDD. When the power supply switch 55 goes off, the power supply switch 55 stops supplying the first circuit block 53 and the level shift circuit 56 with the high potential voltage VD1. The high potential voltage VDD is supplied to the second circuit block 54 and the level shift circuit 56.

Accordingly, the high potential voltage VD1 is intermittently supplied to the first circuit block 53 and the level shift circuit 56 (more specifically, part of the level shift circuit 56) in accordance with the activation and inactivation of the power supply switch 55. Thus, the supply of the high potential voltage VD1 may easily be controlled by controlling the activation and inactivation of the power supply switch 55. The high potential voltage VDD is supplied to the second circuit block 54 and the level shift circuit 56 (more specifically, another part of the level shift circuit 56) regardless of the activation and inactivation of the power supply switch 55. In another embodiment, the high potential voltage VD1 corresponds to the first voltage, and the high potential voltage VDD corresponds to the second voltage.

The switch control signal SC is generated in accordance with the operation control signal OC. That is, the power supply switch 55 is activated and inactivated in accordance with the operation state of the semiconductor integrated circuit device 50. Accordingly, the first circuit block 53 is activated and inactivated in accordance with the operation of the semiconductor integrated circuit device 50, and the second circuit block 54 is driven regardless of the operation state of the semiconductor integrated circuit device 50.

When the level shift circuit 56 is supplied with the first high potential voltage VD1 and the second high potential voltage VDD, the level shift circuit 56 converts a signal Sin having the level of the first potential voltage VD1, which is supplied from the first circuit block 53, into a signal Sout having the level of the second high potential voltage VDD and provides the signal Sout to the second circuit block 54. Further, when not supplied with the first high potential voltage VD1, the level shift circuit 56 holds the input signal level of the second circuit block 54 based on the second high potential voltage VDD. Thus, the semiconductor integrated circuit device 50 of another embodiment functions in two operation modes.

In the first operation mode, the first and second circuit blocks 53 and 54 are both activated. In the second operation mode, the first circuit block 53 is inactivated, and the second circuit block 54 is inactivated. A specific example of such a semiconductor integrated circuit device 50 will now be described.

The semiconductor integrated circuit device 50 is used in an apparatus for displaying images such as a projector. The first circuit block 53 is an image processing circuit that processes image data stored in a storage circuit (for example, decompresses compressed image data) and outputs the processed data. The second circuit block 54 is a drive circuit that displays images. The second circuit block 54 stores the processed data output from the first circuit block 53 and drives a display panel, such as a liquid crystal display (LCD), in accordance with the stored data.

A projector that displays images functions in a slide mode, in which the displayed image changes in fixed time intervals, and a fixed display mode, in which the same image is displayed. In the slide mode, the first circuit block 53 processes the data of the next image that is to be displayed, and the second circuit block 54 outputs the processed data to the display panel. In the fixed display mode, the second circuit block 54 outputs image data to the display panel. However, the first circuit block 53 may be inactivated as long as the displayed image remains the same. In accordance with the operation mode, the operation controller 51 generates the control signal OC at an H level in the slide mode and generates the control signal at an L level in the fixed display mode.

The power supply switch controller 52 generates an H level switch control signal SC in response to the H level control signal OC and generates an L level switch control SC in response to the L level control signal OC. Accordingly, the first high potential voltage VD1 is supplied to the first circuit block 53 (and the level shift circuit 56) in the slide mode, and the supply of the first high potential voltage VD1 is stopped in the fixed display mode.

Figure 4:
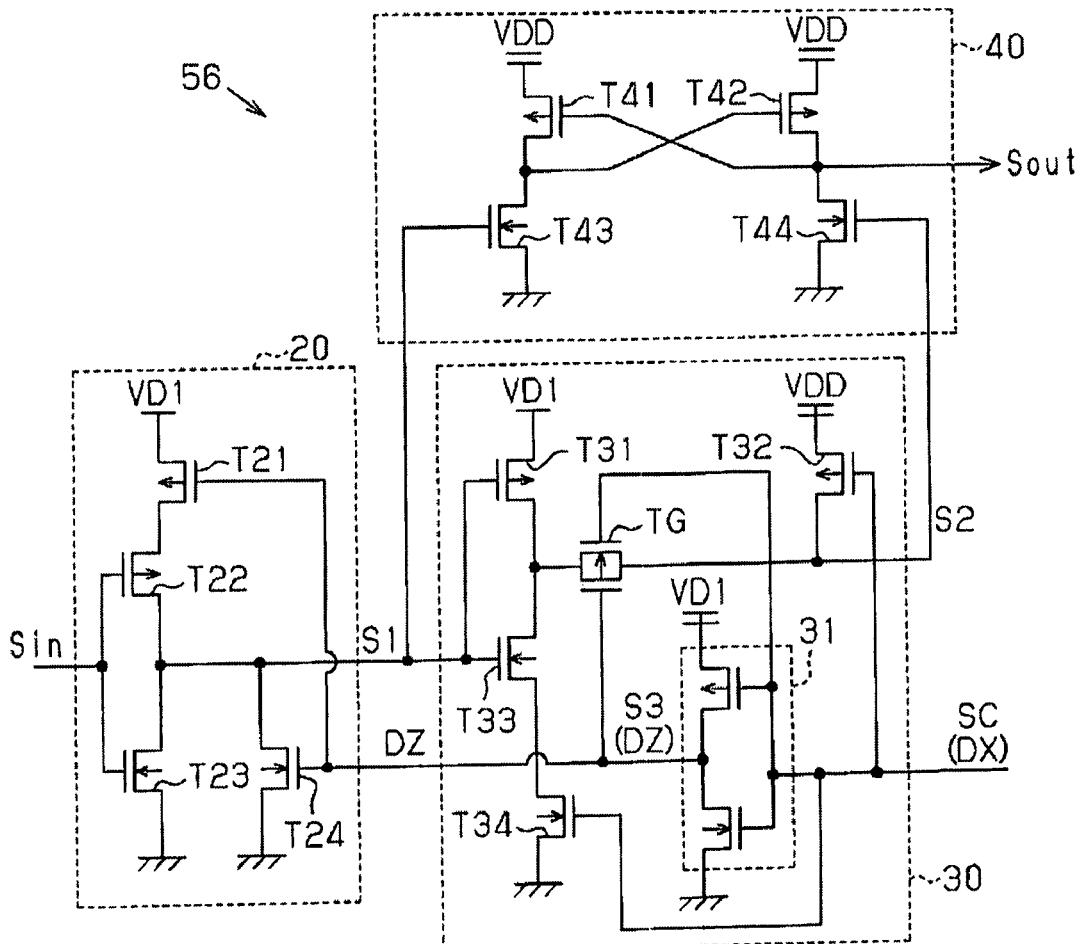
FIG. 4 is a schematic circuit diagram of a level shift circuit of FIG. 3.

Referring to FIG. 4, the level shift circuit 56 of another embodiment includes the first logic unit 20, second logic unit 30, and level converter 40 but does not include the voltage detector 10. This is because the semiconductor integrated circuit device 50 controls the supply of the high potential voltage VD1 to the first circuit block 53 and the level shift circuit 56 in accordance with its operation mode. Accordingly, there is no need for the level shift circuit 56 to detect whether or not the high potential voltage VD1 is actually supplied.

The inverter circuit 31 of the second logic unit 30 is provided with the switch control signal SC, which functions as the detection signal DX. The output terminal of the inverter circuit 31 is connected to the gates of the transistors T21 and T24 in the first logic unit 20. The inverter circuit 31 inverts the logic of the switch control signal SC (detection signal DX) to generates the signal S3 (detection signal DZ). Accordingly, in the level shift circuit 56 of another embodiment, the inverter circuit 31 of the second logic unit 30 functions to generate the detection signal DZ, which has a logically inverted value of the detection signal DX.

In the same manner as one embodiment, when supplied with the first high potential voltage VD1 and the second high potential voltage VDD, the level shift circuit 56 generates the signal Sout, which has a logically inverted value of the input signal Sin. When the supply of the first high potential voltage VD1 is stopped and only the second high potential voltage VDD is supplied to the level shift circuit 56, the level shift circuit 56 generates the signal Sout having a fixed level (L level) in response to the switch control signal SC.

In another embodiment, plural bits of data may be sent in parallel via a plurality of signal lines from the first circuit block 53 to the second circuit block 54. In this case, the level shift circuit 56 shown in FIG. 4 is provided in a quantity corresponding to the quantity of the signal lines. In other words, the plurality of level shift circuits 56 are connected to the first circuit block 53 by a plurality of signal lines and connected to the second circuit block 54 by a plurality of signal lines. When the first circuit block 53 sends plural bits of data in serial to the second circuit block 54 via a single signal line, a single level shift circuit 56 is provided for the single signal line, as shown in FIG. 4.

In addition to advantages (1) to (5) of one embodiment, the level shift circuit 56 of another embodiment has the advantages described below.

(6) The level shift circuit 56 is provided with the switch control signal SC, which controls the operation (activation and inactivation) of the power supply switch 55, in accordance with the operation state of the semiconductor integrated circuit device 50. In response to the switch control signal SC, the level shift circuit 56 generates the output signal Sout having the logically inverted value of the input signal Sin or the output signal Sout having a fixed level (L level). In this structure, the supply of the first high potential voltage VD1 to the first circuit block 53 and the level shift circuit 56 is stopped in accordance with the operation mode. This reduces the consumption current during operation of the apparatus. Further, when the supply of the first high potential voltage VD1 is stopped, by fixing the level of the input signal of the second circuit block 54, erroneous operation of the second circuit block 54 is stopped.

It should be apparent to those skilled in the art that the embodiments may be embodied in many other specific forms without departing from the spirit or scope of the embodiments. Particularly, it should be understood that the embodiments may be embodied in the following forms.

Figure 5:
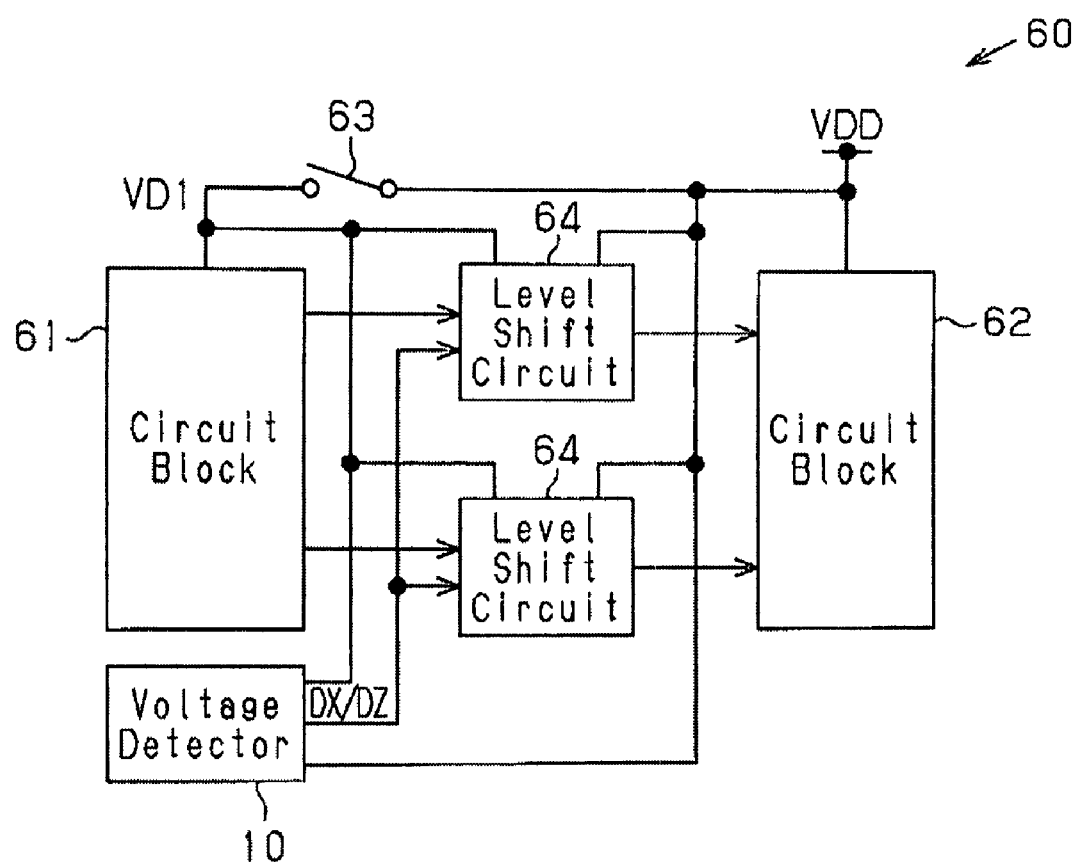
FIG. 5 is a schematic block circuit diagram of another semiconductor integrated circuit device including the level shift circuit of FIG. 4.

In one embodiment, the level shift circuit 1 does not necessarily have to be provided with the voltage detector 10. In the same manner as another embodiment, the level shift circuit 1 may be configured by the first logic unit 20, the second logic unit 30, and the level converter 40. In this case, for example, as shown in FIG. 5, a semiconductor integrated circuit device 60 includes a single voltage detector 10 for a plurality (for example, two) level shift circuits 64. In the semiconductor integrated circuit device 60, a first circuit block 61 outputs two signals, the levels of which is shifted by the two level shift circuits 64. In the same manner as another embodiment, a power supply switch 63 starts and stops the supply of the first high potential voltage VD1, which is based on the high potential voltage VDD, to the first circuit block 61. The second circuit block 62 is supplied with the second high potential voltage VDD. The level shift circuits 64 each include the first logic unit 20, the second logic unit 30, and the level converter 40. The operation of each level shift circuit 64 is controlled by the single voltage detector 10. The semiconductor integrated circuit device 60 (level shift circuits 64) have the same advantages as the aforementioned embodiments.

Figure 6:
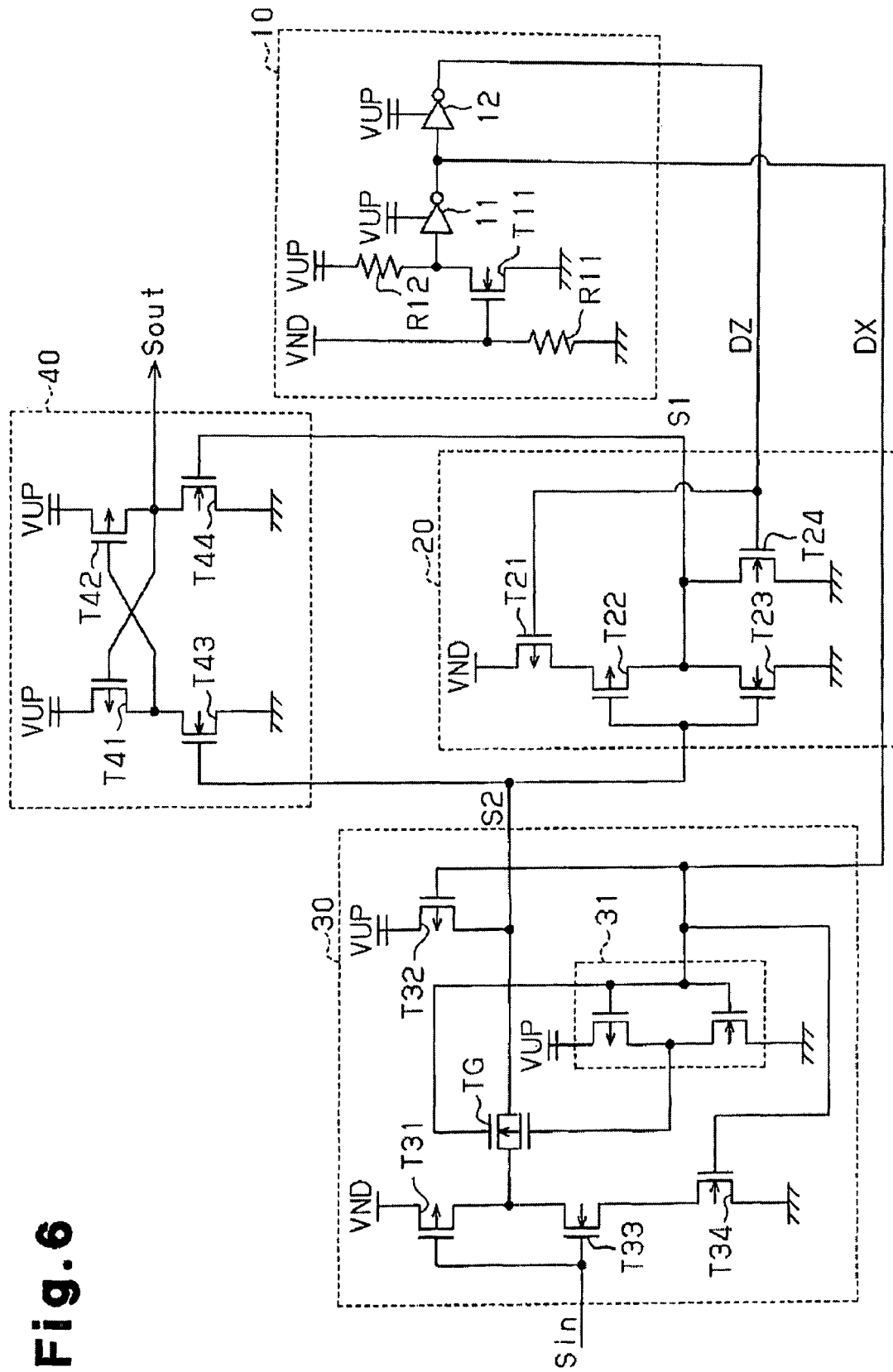
FIG. 6 is a schematic circuit diagram of a level shift circuit in accordance with another embodiment.

The level shift circuit 1 shown in FIG. 2 may be modified as shown in FIG. 6. In the level shift circuit of FIG. 6, a second logic unit 30 including a NAND circuit is supplied with an input signal Sin, and a first logic unit 20 including a NOR circuit is supplied with a second control signal S2 that is generated by the second logic unit 30. In the same manner as in the above embodiment, the level shift circuit of FIG. 3 does not require additional capacitance. When the level shift circuit is not supplied with the first high potential voltage VND but is supplied with the second high potential voltage VUP, the logic of the level converter 40 is determined to be at a predetermined level. In other words, an output signal Sout is clamped at the H2 level.

The transfer gate TG of the second logic unit 30 may be a P-channel MOS transistor or an N-channel MOS transistor that is driven in a manner complementary to the transistor T32.

The output signal Sout may be generated at a node between the transistor T41 and the transistor T43 in the level converter 40.

In one embodiment, the inverter circuit 12 of the voltage detector 10 may be detected, and in the same manner as another embodiment, the output signal S3 of the inverter circuit 31 may be provided as the detection signal DZ to the first logic unit 20. Further, in another embodiment, the level shift circuit 56 may include an additional inverter circuit that inverts the logic of the switch control signal SC (detection signal DX). In this case, the first logic unit 20 is provided with the detection signal DZ, which is generated by the additional inverter circuit.

In one embodiment, the first high potential voltage VND and the second high potential voltage VUP may be set at the same value, and a level shift circuit may output an output signal Sout having the same voltage as the input signal Sin. Alternatively, the first high potential voltage VND may be set to be lower than the second high potential voltage VUP, and a level shift circuit may output an output signal Sout having a lower voltage level than the input signal Sin. In the same manner, in another embodiment, the high potential voltage VD1 and the high potential voltage VDD may be separately supplied or the high potential voltage VDD may be voltage-converted to generate the high potential voltage VD1 so as to generate the high potential voltage VD1 that is lower or higher than the high potential voltage VDD. That is, level shift circuits in the aforementioned embodiments may be a level shift circuit that increases the level of the input signal, decreases the level of the input signal, or outputs a signal having the same level as the input signal.

The level shift circuit described in Japanese Laid-Open Patent Publication No. 2003-17996 may not be able to determine the gate voltage of each of the transistors N3 and N4 when the high power supply voltage rises very slowly. Further, the semiconductor device described in Japanese Laid-Open Patent Publication No. 9-135160 may not be able to determine the logic value. In the level shift circuit described in Japanese Laid-Open Patent Publication No. 5-315931, the transistor QN1 is connected to a node T1. Thus, the load capacitance at the node T1 may increase and the lower the operation speed of the circuit. Moreover, the capacitance at the node T1 and the capacitance at a node T2 may become unbalanced and destabilize the operation of the level shift circuit.

One preferred embodiment provides a level shift circuit that determines its logic value while preventing the load capacitance from increasing.

One embodiment is a level shift circuit receiving a first voltage and a second voltage and generating an output signal from an input signal. The level shift circuit includes a first logic unit receiving the input signal and generating a first control signal in accordance with an operation control signal indicating a supply state of the first voltage. The first logic unit generates a first control signal in accordance with the input signal when the level shift circuit is supplied with the first and second voltages. The first logic unit generates the first control signal at a predetermined first level when the level shift circuit is supplied with only the second voltage. A second logic unit, coupled to the first logic unit, generates a second control signal in accordance with the operation control signal. The second logic unit generates the second control signal in accordance with the first control signal when the level shift circuit is supplied with the first and second voltages. The second logic unit generates the second control signal at a predetermined second level when the level shift circuit is supplied with only the second voltage. A level converter, coupled to the first logic unit and the second logic unit, generates the output signal in response to the first and second control signals.

Another embodiment provides a level shift circuit receiving a first voltage and a second voltage and generating an output signal from an input signal. The level shift circuit includes a voltage detector detecting a state of the first voltage and a state of the second voltage and generating a detection signal. A first logic unit, coupled to the voltage detector, generates a first control signal in response to the detection signal. The first logic unit generates the first control signal in accordance with the input signal when the level shift circuit is supplied with the first and second voltages. The first logic unit generates the first control signal at a predetermined first level when the level shift circuit is supplied with only the second voltage. A second logic unit, coupled to the voltage detector and the first logic unit, generates a second control signal in response to the detection signal. The second logic unit generates the second control signal in accordance with the first control signal when the level shift circuit is supplied with the first and second voltages. The second logic unit generates the second control signal at a predetermined second level when the level shift circuit is supplied with, only the second voltage. A level converter, coupled to the first logic unit and the second logic unit, generates the output signal in response to the first and second control signals.

A further embodiment is a level shift circuit for operation by a first voltage, a second voltage that is higher than the first voltage, and a third voltage that is lower than the first and second voltages to generate from an input signal that shifts between the first voltage and the third voltage an output signal that shifts between the second voltage and the third voltage. The level shift circuit includes a voltage detector detecting whether or not the first voltage is supplied to the level shift circuit and generating a detection signal indicating the detection result. A first logic unit, coupled to the voltage detector, generates in response to the detection signal a first control signal having one of a level that is in accordance with the input signal and a predetermined first level. A second logic unit, coupled to the voltage detector and the first logic unit, generates in response to the detection signal a second control signal having one of a level that is in accordance with the first control signal and a predetermined second level that differs from the first predetermined level. A level converter, coupled to the first logic unit and the second logic unit, generates the output signal in response to the first and second control signals. The level converter clamps a logic of the output signal to the first level or the second level when the level shift circuit is not supplied with the first voltage.

The present examples and embodiments are to be considered as illustrative and not restrictive, and the invention is not to be limited to the details given herein, but may be modified within the scope and equivalence of the appended claims.

What is claimed is:

1. A level shift circuit comprising:
   a first logic unit, based on an input signal and a first operation control signal indicating a supply state of a first voltage, generating a first control signal in accordance with the input signal when the level shift circuit is supplied with the first voltage and a second voltage, and including a first transistor which clamps the first control signal at a predetermined first level based on the first operation control signal when the level shift circuit is supplied with the second voltage;
   a second logic unit, based on the first control signal and a second operation control signal indicating the supply state of the first voltage, generating a second control signal in accordance with the first control signal when the level shift circuit is supplied with the first and second voltages, and including a second transistor which clamps the second control signal at a predetermined second level based on the second operation control signal when the level shift circuit is supplied with the second voltage; and
   a level converter, generating an output signal in response to the first and second control signals.

2. The level shift circuit according to claim 1, further comprising:
   a switch switching between states in which the first voltage is supplied to the level shift circuit and not supplied to the level shift circuit in accordance with the second operation control signal.

3. The level shift circuit according to claim 2, wherein the first voltage is lower than the second voltage.

4. A level shift circuit comprising:
   a voltage detector detecting a state of a first voltage supplied and a state of a second voltage supplied and generating a first detection signal and a second detection signal;
   a first logic unit, coupled to the voltage detector, generating a first control signal in response to the first detection signal, wherein the first logic unit generates the first control signal in accordance with an input signal when the level shift circuit is supplied with the first and second voltages, and the first logic unit includes a first transistor which clamps the first control signal at a predetermined first level based on the first detection signal when the level shift circuit is supplied with the second voltage;

a second logic unit, coupled to the voltage detector and the first logic unit, generating a second control signal in response to the second detection signal, wherein the second logic unit generates the second control signal in accordance with the first control signal when the level shift circuit is supplied with the first and second voltages, and the second logic unit includes a second transistor which clamps the second control signal at a predetermined second level based on the second detection signal when the level shift circuit is supplied with the second voltage; and a level converter, coupled to the first logic unit and the second logic unit, generating an output signal in response to the first and second control signals.

5. The level shift circuit according to claim 4, wherein the level converter generates the output signal at a fixed level in response to the first control signal having the first level and the second control signal having the second level when the level shift circuit is supplied with the second voltage.

6. The level shift circuit according to claim 4, wherein one of the first logic unit and the second logic unit includes a NOR circuit, and the other one of the first logic unit and the second logic unit includes a NAND circuit.

7. The level shift circuit according to claim 6, wherein the NAND circuit includes a third transistor that receives the first voltage and is driven by the input signal or the first control signal, and the second transistor that receives the second voltage and is driven by the second detection signal, the level shift circuit further comprising:

a switch circuit coupled between the third transistor and the second transistor and driven by the second detection signal in a manner complementary to the second transistor.

8. The level shift circuit according to claim 7, wherein the switch circuit includes:

an inverter circuit, coupled to the voltage detector, which inverts the second detection signal and generates an inversion signal of the second detection signal; and a transfer gate coupled to the inverter circuit and arranged between the third and second transistors and driven in a manner complementary to the second transistor in response to the second detection signal and the inversion signal of the second detection signal.

9. The level shift circuit according to claim 4, wherein the voltage detector is operated by the first voltage, the second voltage that is higher than the first voltage, and a third voltage that is lower than the first and second voltages, and the voltage detector generates the first and second detection signals with the second voltage and the third voltage when the level shift circuit is supplied with the second voltage.

10. The level shift circuit according to claim 4, wherein:
the voltage detector detects the state of the first voltage and the state of the second voltage to generate the first detection signal and the second detection signal that are complementary to each other; and the first logic unit receives the first detection signal; and
the second logic unit receives the second detection signal.

11. The level shift circuit according to claim 10, wherein the voltage detector receives a third voltage that is lower than the first and second voltages, and the voltage detector includes:

a first resistor having a first terminal that receives the third voltage and a second terminal that receives the first voltage;

a second resistor having a first terminal and a second terminal, which receives the second voltage;

an N-channel MOS transistor having a gate coupled to the second terminal of the first resistor, a source receiving the third voltage, and a drain coupled to the first terminal of the second resistor;

a first inverter circuit having an input terminal coupled to the drain of the N-channel MOS transistor and an output terminal, wherein the first inverter circuit receives the second voltage and generates the second detection signal; and a second inverter circuit having an input terminal coupled to the output terminal of the first inverter circuit and an output terminal, wherein the second inverter circuit receives the second voltage and generates the first detection signal.

12. The level shift circuit according to claim 4, wherein:
the voltage detector detects the state of the first voltage and the state of the second voltage to generate the first and second detection signals;

the second logic unit is operated by the second detection signal and inverts logic of the second detection signal to generate the first detection signal; and the first logic unit is operated by the first detection signal.

13. The level shift circuit according to claim 4, wherein the level converter receives a third voltage that is lower than the first and second voltages, and the level converter includes:

a first P-channel MOS transistor having a source that receives the second voltage, a drain, and a gate;

a second P-channel MOS transistor having a source that receives the second voltage, a drain coupled to the gate of the first P-channel MOS transistor, and a gate coupled to the drain of the first P-channel MOS transistor;

a first N-channel MOS transistor having a source that receives the third voltage, a drain coupled to the drain of the first P-channel MOS transistor, and a gate that receives the first control signal; and a second N-channel MOS transistor having a source receiving the third voltage, a drain coupled to the drain of the second P-channel MOS transistor, and a gate that receives the second control signal.

14. A level shift circuit for operation by a first voltage, a second voltage that is higher than the first voltage, and a third voltage that is lower than the first and second voltages to generate from an input signal that shifts between the first voltage and the third voltage an output signal that shifts between the second voltage and the third voltage, the level shift circuit comprising:

a voltage detector detecting whether or not the first voltage is supplied to the level shift circuit and generating first and second detection signals indicating the detection result;

a first logic unit, coupled to the voltage detector, generating in response to the first detection signal a first control signal having one of a level that is in accordance with the input signal and a predetermined first level, and including a first transistor which clamps the first control signal at the predetermined first level based on the first detection signal;

a second logic unit, coupled to the voltage detector and the first logic unit, generating in response to the second detection signal a second control signal having one of a level that is in accordance with the first control signal and a predetermined second level that differs from the first predetermined level, and including a second transistor which clamps the second control signal at the predetermined second level based on the second detection signal; and a level converter, coupled to the first logic unit and the second logic unit, generating the output signal in response to the first and second control signals, wherein the level converter clamps a logic of the output signal to the first level or the second level when the level shift circuit is not supplied with the first voltage.

15. The level shift circuit according to claim 14, wherein the first level is the level of the third voltage, and the second level is the level of the second voltage.

16. The level shift circuit according to claim 15, further comprising:

a switch circuit, coupled to the voltage detector and the second logic circuit, preventing current from flowing from the second voltage to the first voltage when the level shift circuit is not supplied with the first voltage.

17. The level shift circuit according to claim 16, wherein the switch circuit includes a transfer gate operated by the second voltage and the third voltage.

18. The level shift circuit according to claim 16, wherein:

the first logic unit includes a NOR circuit, which generates the first control signal having the first level in response to the first detection signal; and the second logic unit includes a NAND circuit, which generates the second control signal having the second level in response to the second detection signal.

19. The level shift circuit according to claim 18, wherein:

the NAND circuit is driven by the first to third voltages; and the switch circuit prevents current from flowing from the second voltage to the first voltage in the NAND circuit when the level shift circuit is not supplied with the first voltage.

20. The level shift circuit according to claim 18, wherein:

the voltage detector generates the first detection signal having the level of the second voltage and the second detection signal having the level of the third voltage when the level shift circuit is not supplied with the first voltage;

the NOR circuit receives the first detection signal; and the NAND circuit receives the second detection signal.

* * * * *